Aug. 17, 1965 R. N. HALL 3,201,666
NON-RECTIFYING CONTACTS TO SILICON CARBIDE
Original Filed Aug. 16, 1957
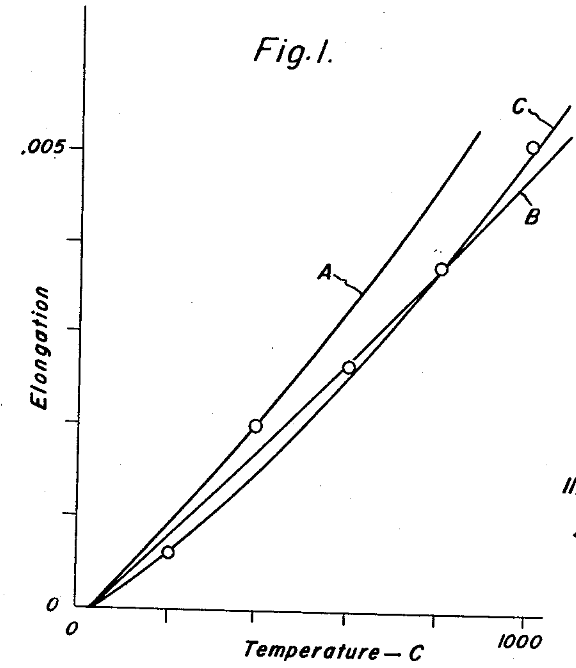
Fig. 2.
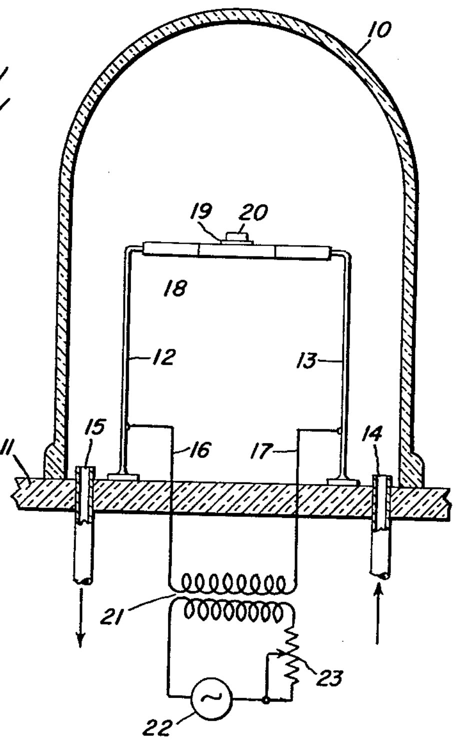
Fig. 3.
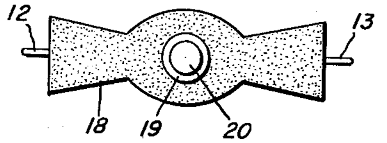
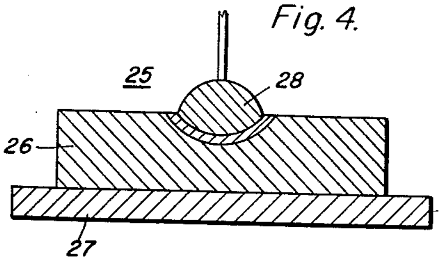
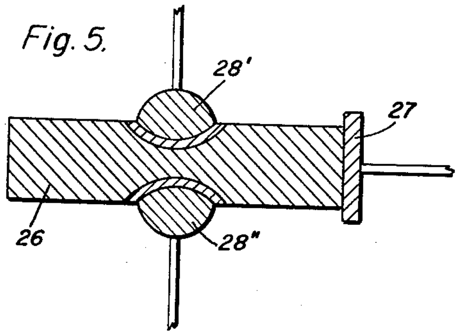
Inventor:
Robert N. Hall,
by John F. Ahern
His Attorney.

3,201,666
NON-RECTIFYING CONTACTS TO SILICON CARBIDE

Robert N. Hall, Schenectady, N.Y., assignor to General Electric Company, a corporation of New York Original application Aug. 16, 1957, Ser. No. 678,740, now Patent No. 3,030,704, dated Apr. 24, 1962. Divided and this application Dec. 18, 1961, Ser. No. 159,932
4 Claims. (Cl. 317—237)

The present invention relates to silicon carbide semiconductor devices and methods for preparation thereof. More particularly the invention relates to an improved method for making non-rectifying contacts to silicon carbide semiconductor bodies and to improved semiconductor devices produced thereby. This application is a division of my co-pending application S.N. 678,740, now U.S. Patent No. 3,030,704, filed August 16, 1957, and assigned to the present assignee.

It is well known that extremely useful signal translating devices, such as rectifiers and transitors, may be provided in the form of semiconductor bodies such as germanium or silicon containing at least two regions of opposite conductivity type separated by a rectifying barrier or P-N junction. Two such P-N junctions separated by a very thin intermediate or base region comprise the heart of the junction transistor. In this device, minority conduction carriers are injected into the base region at one P-N junction. Two such P-N junctions separated by a tion to change the conductivity characteristics thereof. This mechanism permits the generation, amplification and translation of electrical signals.

Rectifiers and transistors fabricated from semiconductors such as germanium and silicon, although quite satisfactory for these purposes, do not function effectively at elevated temperatures. Thus, for example, in germanium semiconductor devices operated at a temperature in excess of 150° C. the conductivity characteristics of the device tend to become intrinsic. That is to say, at such temperatures, the number of thermally excited conduction carriers markedly increases. Under these conditions P-N junctions tend to lose their asymmetrically conductive characteristics. Additionally, at such high temperatures in transistors, minority conduction carrier injection processes cease to control the conductivity characteristics of the devices. In silicon semiconductor devices the same effects occur at temperatures in excess of 250° C.

Accordingly, for high temperature operation, it is desirable that semiconductor devices be fabricated from a semiconductor which remains extrinsic at high temperature. Silicon carbide is such a semiconductor, remaining extrinsic at temperatures the order of 1000° C. Due to its high melting point and other physical properties, however, silicon carbide is extremely difficult material with which to work, and many physical processes which are simple and straightforward utilizing germanium and silicon are difficult, if not impossible, utilizing silicon carbide.

One obstacle which has heretofore hampered the production of silicon carbide semiconductor devices has been the extreme difficulty encountered in attempting to form non-rectifying broad area contacts to silicon carbide bodies. This difficulty is caused in part by the low thermal expansion coefficient of silicon carbide. Due to the wide temperature range over which silicon carbide semiconductor devices are operated it is essential that a silicon carbide body have area contacts which are made from materials having thermal coefficients of expansion close to those of silicon carbide. Otherwise, on heating and cooling, crazing, cracking and fracture of the contacts occurs. Most metals conventionally utilized to form contacts to semiconductor bodies, however, possess coefficients of thermal expansion much higher than silicon carbide.

Accordingly, one object of the present invention is to provide an improved method for forming non-rectifying broad area contacts to silicon carbide.

A further object of the invention is to provide improved non-rectifying broad area contacts to silicon carbide utilizing materials having coefficients of expansion which closely match that of silicon carbide.

A further object of the present invention is to provide improved silicon carbide semiconductor devices.

In accord with the present invention I provide non-rectifying broad area contacts to silicon carbide bodies by contacting the silicon carbide with a body of tungsten, molybdenum or an alloy therebetween in a non-reactive atmosphere and heating the contacted materials to a temperature which is at least as high as the eutectic temperature of the silicon carbide-contact material system, and maintaining the contacted materials at this temperaure until a wetting between the two materials is observed. When this wetting is observed, the heating cycle is discontinued and the sample allowed to cool. Upon cooling, a non-rectifying contact is found to have been formed between the two materials. This contact is extremely rugged, does not fracture with large temperature changes and possesses superior electrical chaarcteristics.

The novel features believed characteristic of the invention are set forth in the appended claims. The invention itself, together with further objects and advantages thereof, may best be understood by reference to the following description taken in connection with the accompanying drawing in which:

FIG. 1 is a graph showing thermal expansion of selected materials as a function of temperature;

FIG. 2 represents a schematic illustration of an apparatus with which contacts may be formed in accord with the present invention;

FIG. 3 is an elevation view of a graphite heater utilized in the apparatus of FIG. 1;

FIG. 4 is a vertical cross-section of a silicon carbide rectifier constructed in accord with the present invention; and FIG. 5 is a vertical cross-section of a silicon carbide transistor constructed in accord with the present invention.

Silicon carbide, as is mentioned hereinbefore, possesses useful semiconductor characteristics from extremely low temperatures to temperatures of the order of 1000° C. Useful broad area silicon carbide semiconductive devices, operable over a substantial portion of this range, require large area contacts which withstand the thermal expansion and contraction which accompanies large temperature changes without mechanical failure. While this problem may be minimized in most semiconductor devices for small-area rectifying contacts (such as, for example, the emitter and collector contacts of a junction transistor) it is difficult to minimize this problem in base contacts which are often of much larger area. Similarly, the non-rectifying contact of silicon carbide rectifiers is susceptible to this problem. One approach to the problem is to form the contact utilizing a material whose thermal expansion coefficient closely approximates silicon carbide over the operating temperature range.

Heretofore, base contacts have generally been made to semiconductor bodies by fusing thereto a material having an appropriate thermal coefficient, with a suitable solder. In attempting to form such contacts to silicon carbide, this approach was utilized. Molybdenum and tungsten were chosen as the most suitable contact materials since, over the temperature range of from 0° C. to 1000° C., molybdenum and tungsten closely approximate the available data on thermal expansion of silicon carbide. Thus, in FIG. 1, the encircled dots represent data on the thermal expansion of silicon carbide from 0° C. to 1000° C. according to Bussem (Ber. Deut. Keram, Ges. 16, 381, 1935), and curves A, B and C are the thermal expansion characteristics over this temperature range for molybdenum, tungsten and a 46 atomic percent tungsten in molybdenum alloy respectively.

Contacts were first made utilizing a solder of approximately equal parts of nickel and titanium to bond the silicon carbide bodies to the tungsten or molybdenum base plate. These contacts, however, did not appear to have sufficient mechanical strength and, furthermore, suffered the disadvantage of melting or becoming plastic at relatively low temperatures due to the use of a low melting-point solder.

According to the present invention, however, I have found that superior non-rectifying contacts to silicon carbide bodies may be made by fusing molybdenum, tungsten or alloys of these two metals, directly to silicon carbide bodies at a temperature above the eutectic point of the ternary system formed between silicon, carbon and the metal utilized but below the melting point of either silicon carbide or the contact material. This concept is based on the discovery that although tungsten, molybdenum and silicon carbide all have extremely high melting points, when silicon carbide and a slab of tungsten, molybdenum or a tungsten-molybdenum alloy are brought into intimate contact in a non-reactive atmosphere a eutectic molten phase is formed between the two at a temperature in the vicinity of 1800° C.

In the practice of the present invention, therefore, a tungsten, molybdenum, or tungsten-molybdenum alloy plate is place in a horizontal position, a wafer of silicon carbide, preferably monocrystalline, is brought into intimate contact therewth in a suitable non-reactive atmosphere and the contacted materials are heated to a temperature of from 1700° C. to 1900° C. while being closely scrutinized by the operator. After a brief period of time, which may be from several seconds to one minute, depending upon the exact temperature utilized, a molten phase is observed to form where the silicon carbide contacts the metallic plate. As soon as the presence of the molten phase is observed, the heating cycle is discontinued. Upon cooling, the silicon carbide is found to be fused to the metallic plate. The contact between the metallic plate is non-rectifying, possesses ohmic characteristics over the operating temperature from 0° C. to 1000° C., and exhibits a resistance, the absolute value of which is lower than the bulk resistance of the silicon carbide itself, thus making the contact ideally suited for a non-rectifying contact in silicon carbide semiconductor devices. Contacts so formed additionally do not suffer deleterious effects from large temperature variations since the constituent materials are closely matched in thermal coefficient of expansion and large area contacts may be made and subjected to large temperature variations without cracking, crazing or other deleterious effects due to thermal expansion. These contacts also do not suffer deleterious effects at high temperature operation as do contacts made utilizing alloy solders between silicon carbide and either tungsten and molybdenum or alloys of these materials.

In FIG. 2 of the drawing there is illustrated schematically a suitable apparatus in which the present invention may be practiced. In FIG. 2 a reaction chamber 10 is mounted upon and preferably vacuum sealed to a suitable non-conducting base member 11 upon which metallic support members 12 and 13 are mounted. Gas inlet pipe 14 and gas outlet pipe 15 pass through supporting base 11, as do electrical leads 16 and 17. As one means for supporting and heating the materials to be fused, a suitable thin strip of graphite 18 is mounted between and electrically connected with supporting members 12 and 13. A metallic disk 19 is placed upon the center of graphite strip 18 and a wafer 20 of silicon carbide is disposed and in intimate thermal contact with metallic disk 19. Preferably metallic disk 19 and silicon carbide crystal 20 are lapped and ground to have planar faces to facilitate intimate contact therebetween. Metallic disk 19 may conveniently comprise tungsten, molybdenum or an alloy of tungsten and molybdenum. Silicon carbide crystal 20 is preferably a highly purified monocrystalline wafer of silicon carbide substantially the same as those utilized in the practice of the invention disclosed and claimed in my copending application Serial No. 678,739, now Patent 2,918,396, filed concurrently herewith and assigned to the assignee of the present invention.

Heating to cause fusion between metallic base plate 19 and silicon carbide crystal 20 is provided by passing an electric current which conveniently may be 100 amperes at 10 volts alternating current, supplied through transformer 21 by alternating current generator 22. The magnitude of current and, consequently, the temperature of disk 19 may be conveniently controlled by potentiometer 23. Alternatively, the contact materials 19 and 20 may be heated by a suitable induction heater coil supplied by radio frequency voltage and similarly controlled.

In FIG. 3 of the drawing there is shown a horizontal plan view of a suitable graphite strip upon which the contacting materials may be mounted. The particular configuration illustrated in FIG. 2 is convenient to insure uniform heating over the entire surface of the graphite strip upon which base contact disk 19 is supported.

In the practice of the invention, metallic disk 19 is preferably first mounted upon graphite strip 18 and a silicon carbide wafer 20, preferably monocrystalline, which may conveniently be ground and lapped to obtain a planar surface thereupon, is placed upon metallic disk 19. Alternatively, wafer 20 may be placed upon graphite strip 18 and a few milligrams of contact material placed thereupon. Evacuable reaction chamber 10 is then sealed to base support 11 and the entire system is substantially evacuated or flushed with a suitable non-reactive gas, which may conveniently be any of the inert gases or hydrogen, but preferably comprises argon, helium or hydrogen. Gas is conveniently supplied at atmospheric pressure, although higher or lower pressures may be utilized without departing from the invention.

Power is then supplied to cause electric current to flow through graphite strip 18 and is controlled by potentiometer 23. In performing the invention the operator closely observes the interface between the silicon carbide wafer and the metallic plate as the temperature is increased. When the temperature of the contact materials at the silicon carbide-contact material interface reaches the vicinity of 1800° C., an appreciable wetting of the silicon carbide by a molten phase formed between the silicon carbide and the metallic base plate is observed. The exact temperature of the silicon carbide-contact material interface at which the appearance of the molten phase is observed may vary from 1700° C. to 1900° C. depending upon the perfectness of the contact between the silicon carbide and the metallic plate, the exact composition of the base plate utilized. Additionally, the observed temperature depends upon the order of stacking the contact materials upon the graphite heater. Since the quantity of metal and silicon carbide utilized is quite small, optical pyrometer observation of the graphite filament temperature is the most practical method of determining the temperature of the samples. With the metallic member contacting the graphite strip the temperature of the graphite strip is essentially that of the silicon carbide-contact material interface and alloying occurs at approximately 1700° C. for molybdenum and at approximately 1800° C. for tungsten. With the silicon carbide wafer contacting the graphite strip, the apparent temperature at which alloying occurs may be somewhat higher. This difference is probably due to the low thermal conductivity of the silicon carbide as compared with tungsten and molybdenum. I prefer to heat the materials with the metallic disk contacting the graphite strip. Under these conditions the contact material is heated to a temperature of at least 1700° C. if molybdenum is used, and to at least 1800° C. if tungsten is used. These temperatures are maintained for a time which may vary from one second to one minute to cause fusion. Preferably, however, the temperature is maintained at 1700° C.–1800° C. for molybdenum and 1800° C.–1900° C. for tungsten, each for a few seconds. Immediately upon observation of the formation of the molten phase, the electrical power is disconnected, the sample is allowed to cool to room temperature and removed.

Upon cooling, the contact formed between the metallic plate and silicon carbide wafer is found to be strong, withstanding physical shock, and maintaining good mechanical characteristics over the temperature range from 0° C. to 1000° C. Such contacts also exhibit linear nonrectifying characteristics and possess a resistance which is less than the bulk resistivity of silicon carbide, thus suiting them ideally for non-rectifying contacts for silicon carbide semiconductive devices.

In FIG. 4 of the drawing there is illustrated a silicon carbide rectifier utilizing a contact formed in accord with the present invention. In FIG. 4 rectifier 25 comprises a monocrystalline wafer 26 of silicon carbide approximately one-eighth inch square and 0.005 inch thick. A non-rectifying contact is made to silicon carbide wafer 26 by fusing thereto, in accord with the previously described process, a 0.030 inch thick disk 27 one-quarter inch in diameter of tungsten. As is described hereinbefore wafer 27 may also comprise molybdenum or an alloy of tungsten and molybdenum. A rectifying contact is made to the opposite major surface of silicon carbide wafer 26 by suitably fusing thereto an alloy 28 of silicon and a donor or acceptor activator impurity which is chosen to induce opposite conductivity type characteristics into the silicon carbide wafer. If wafer 26 exhibits N-type conductivity characteristics, alloy 28 may comprise an alloy of silicon and aluminum or boron. If wafer 26 is P-type, alloy 28 may comprise an alloy of silicon and arsenic or phosphorus. The formation of such rectifying contacts is disclosed and claimed in my aforementioned copending application Serial No. 678,739.

In FIG. 5 of the drawing there is illustrated a silicon carbide transistor which comprises a monocrystalline wafer 26 of silicon carbide having a base contact 27 applied thereto in accord with the present invention and a pair of oppositely located rectifying contacts 28' and 28'' formed in accord with the aforementioned copending application.

While the invention and the criteria governing the practice thereof have been set forth in detail hereinbefore the following specific examples of the practice of the invention are set forth to teach those skilled in the art specific instances in which the invention may be practiced. The following examples are set forth for illustrative purposes only and are not intended to be utilized in a limiting sense.

*Example 1*

The apparatus illustrated in FIG. 2 is utilized. A tungsten disk approximately ⅛" in diameter and 0.30" thick is mounted upon the carbon heater filament. A single crystal of N-type silicon carbide approximately 1/16" by 3/32" and approximately 0.02" thick is mounted upon the tungsten disk. The chamber is flushed with hydrogen at approximately one atmosphere pressure and the temperature of the carbon filament is raised to 1850° C. and maintained at this temperature for 3 seconds. After 3 seconds, the heating cycle is discontinued and the apparatus is allowed to cool to room temperature. Upon cooling the silicon carbide crystal is observed to be fused to the tungsten disk by a good mechanical bond which exhibits non-rectifying characteristics.

*Example 2*

A tungsten disk approximately ⅛" in diameter and 0.040" thick is mounted upon the carbon filament of the apparatus in FIG. 2. A P-type monocrystalline wafer of silicon carbide ⅛" square and 0.020" thick is mounted upon the tungsten disk. The apparatus is closed and flushed with hydrogen at approximately one atmosphere pressure. The temperature of the filament is raised to approximately 1900° C. and maintained at this temperature for 2 seconds. After the heating cycle, the apparatus is allowed to cool to room temperature. Upon cooling, the silicon carbide crystal is firmly fused to the tungsten disk with a non-rectifying electrical contact.

*Example 3*

Utilizing the apparatus and procedure of Example 1, a non-rectifying contact having strong mechanical characteristics is formed between a ⅛" diameter, 0.040" thick disk of tungsten and a 3/32" square monocrystalline 0.020" thick wafer of P-type silicon carbide by heating the two in an atmosphere of hydrogen for 5 seconds at a temperature of 1850° C.

*Example 4*

Utilizing the apparatus and procedure of Example 1, an N-type silicon carbide wafer approximately 3/32" square and 0.025" thick is fused to a molybdenum disk ¼" in diameter and approximately 0.020" thick by heating the two in an atmosphere of approximately 1 atmosphere of hydrogen at 1750° C. for approximately 15 seconds.

*Example 5*

Utilizing the apparatus and procedure of Example 1, a P-type silicon carbide monocrystalline wafer 1/16" by 1/32" by 0.025" is fused with a strong non-rectifying contact to a ¼" diameter, 0.020" thick molybdenum disk in one atmosphere of hydrogen by heating at a temperature of 1750° C. for five seconds.

*Example 6*

Utilizing the apparatus and procedure of Example 1, a P-type monocrystalline wafer of silicon carbide approximately 3/32" by 3/16" by 0.025" is fused with a mechanically strong non-rectifying electrical contact to a ¼" diameter, 0.020" thick molybdenum disk by heating the two in intimate contact at a temperature of 1740° C. for 3 seconds in approximately 1 atmosphere of hydrogen.

*Example 7*

Utilizing the apparatus of Example 1, an N-type monocrystalline wafer of silicon carbide approximately 1/16" square by 0.020" is fused with a mechanically strong non-rectifying electrical contact to approximately 10 milligrams of a 50 weight percent tungsten molybdenum alloy by heating the silicon carbide having the alloy in contact therewith at a temperature of 1980° C. for 5 seconds in approximately one atmosphere pressure of helium.

While the invention has been set forth hereinbefore with respect to certain embodiments thereof and certain specific examples thereof, it is apparent that many modifications and changes will become immediately apparent to those skilled in the art. Accordingly, by the appended claims I intend to cover all such modifications and changes as fall within the true spirit and scope of the invention.

What I claim as new and desire to secure by Letters Patent of the United States is:

1. A semiconductor device comprising: a body of monocrystalline silicon carbide of a selected conductively type; a base member of a material selected from a group consisting of molybdenum, tungsten, and alloys therebetween; and, an intermediate layer between and in intimate mechanical and non-rectifying electrical broad area contact with said body and said base member, said layer consisting essentially of a eutectic alloy of the materials of said body and the material of said base member.

2. The combination of claim 1 wherein the material of said base member is molybdenum.

3. The combination of claim 1 wherein the material of said base member is tungsten.

4. The combination of claim 1 in which the material of said base metal consists essentially of approximately 46 atomic percent tungsten, the remainder molybdenum.

References Cited by the Examiner

UNITED STATES PATENTS

| | | | |
|---|---|---|---|
| 1,708,571 | 4/29 | Hartmann | 317—24 |
| 2,441,603 | 5/48 | Storks | 317—236 |
| 2,763,822 | 9/56 | Frola et al. | 317—240 |
| 2,789,068 | 4/57 | Maserjian | 317—235 |
| 2,792,538 | 5/57 | Pfann | 317—235 |
| 2,796,563 | 6/57 | Ebers et al. | 317—235 |
| 2,831,787 | 4/58 | Emeis | 317—235 |
| 2,847,335 | 8/58 | Gemmelmaier et al. | 317—235 |

JOHN W. HUCKERT, *Primary Examiner.*

JAMES D. KALLAM, DAVID J. GALVIN, *Examiners.*